United States Patent
Usoskin (10) Patent No.: US 9,640,979 B2
(45) Date of Patent: May 2, 2017

(54) BAND-SHAPED SUPERCONDUCTING ELEMENT WITH IMPROVED SELF-PROTECTION IN CASE OF QUENCHING

(71) Applicant: Bruker HTS GmbH, Hanau (DE)

(72) Inventor: Alexander Usoskin, Hanau (DE)

(73) Assignee: Bruker H I S GmbH, Hanau (DE)

( * ) Notice: Subject to any disclaimer, the term of this patent is extended or adjusted under 35 U.S.C. 154(b) by 190 days.

(21) Appl. No.: 14/327,581

(22) Filed: Jul. 10, 2014

(65) Prior Publication Data

US 2015/0031548 A1 Jan. 29, 2015

(30) Foreign Application Priority Data

Jul. 24, 2013 (DE) .................. 10 2013 214 447

(51) Int. Cl.
   *H01L 39/24* (2006.01)
   *H02H 7/00* (2006.01)
   *H01L 39/16* (2006.01)
   *H01L 39/14* (2006.01)

(52) U.S. Cl.
   CPC ........... *H02H 7/001* (2013.01); *H01L 39/143* (2013.01); *H01L 39/16* (2013.01); *H01L 39/2461* (2013.01)

(58) Field of Classification Search
   CPC ....... H02H 7/001; H01L 39/16; H01L 39/143; H01L 39/2461
   USPC ....................................... 505/230
   See application file for complete search history.

(56) References Cited

U.S. PATENT DOCUMENTS

| | | | |
|---|---|---|---|
| 5,132,283 A | 7/1992 | McCune | |
| 6,114,287 A * | 9/2000 | Lee | ........................ C30B 33/00 117/101 |
| 6,475,311 B1 * | 11/2002 | Fritzemeier | ............ B32B 15/00 148/668 |
| 7,774,035 B2 | 8/2010 | Lee | |
| 2005/0019615 A1 | 1/2005 | Groves | |
| 2009/0131262 A1 | 5/2009 | Zhang | |

(Continued)

FOREIGN PATENT DOCUMENTS

| | | |
|---|---|---|
| DE | 10 2004 048 439 | 4/2006 |
| EP | 2 117 056 | 11/2009 |

(Continued)

*Primary Examiner* — Paul Wartalowicz
(74) *Attorney, Agent, or Firm* — Paul Vincent (57) ABSTRACT

A superconducting element (1) has a metallic substrate (2), an insulating layer (3), a superconductor layer (5) and a metallic protective layer (6), wherein the insulating layer (3) is arranged between the substrate (2) and the superconductor layer (5). In cross-section of the superconducting element (1), the insulating layer (3) extends at both ends past the area ($B_{SL}$) of the substrate (2) covered by the superconductor layer (5) to galvanically separate the superconductor layer (5) and the metallic protective layer (6) from the substrate (2). The thickness D of the insulating layer (3) is selected in such a fashion that the superconducting element (1) has a transverse breakdown voltage between the metallic substrate (2) and both the superconductor layer (5) as well as the metallic protective layer (6) of at least 25 V. The superconducting element has a reduced risk of being damaged in case of a quench.

20 Claims, 3 Drawing Sheets

(56) References Cited

U.S. PATENT DOCUMENTS

| | | | |
|---|---|---|---|
| 2009/0298696 A1* | 12/2009 | Otto | ........................ H01L 39/02 |
| | | | 505/230 |
| 2009/0302282 A1 | 12/2009 | Yoo | |
| 2010/0197506 A1 | 8/2010 | Takahashi | |
| 2011/0319271 A1* | 12/2011 | Selvamanickam | ... H01L 39/143 |
| | | | 505/231 |
| 2012/0040100 A1 | 2/2012 | Matias | |

FOREIGN PATENT DOCUMENTS

| | | |
|---|---|---|
| EP | 2 192 629 | 6/2010 |
| EP | 2 672 537 | 12/2013 |
| JP | 2012028263 | 2/2012 |

\* cited by examiner

BAND-SHAPED SUPERCONDUCTING ELEMENT WITH IMPROVED SELF-PROTECTION IN CASE OF QUENCHING

This application claims Paris convention priority from DE 10 2013 214 447.4 filed Jul. 24, 2013, the entire disclosure of which is hereby incorporated by reference.

BACKGROUND OF THE INVENTION

The invention concerns a superconducting element comprising a metallic substrate, an insulating layer, a superconductor layer and a metallic protective layer, wherein the insulating layer is disposed between the substrate and the superconductor layer.

A superconducting element of this type is disclosed e.g. in the subsequently published European patent application 12 171 087.5.

Superconducting materials can carry large electric currents without ohmic losses. They are used e.g. in magnet coils or also in resistive and inductive fault current limiters.

Superconducting properties are obtained, in particular, only at comparatively low temperatures that typically require cooling with liquid helium. High-temperature superconductors (HTSL), such as YBCO, have higher transition temperatures and current-carrying capacities in comparison with conventional metallic superconductors such as NbTi or Nb3SN. HTSL are, however, difficult to process due to the brittle material properties. For this reason, they are mostly produced in the form of a strip, wherein a thin HTSL layer is deposited on a flexible substrate.

A sudden transition into the normally conducting state ("quench") represents one fundamental risk in the use of superconductors. The current that has previously been superconductingly carried in the superconductor then tries to continue to flow through the normally conducting material. This can result in the development of considerable voltages on the quenched superconductor and of heat due to ohmic losses. There is also the danger of irreversible damage to the superconductor ("burnout").

It is generally desirable for a superconductor to withstand a quench without being damaged. In this respect, superconductors are conventionally protected by parallel normally-conducting current paths with low resistance ("shunt"). In case of a quench, the previously superconducting current can then flow through the parallel current path, thereby reducing the voltage and development of heat. In particular, shunt coatings, e.g. of copper are used as parallel normally-conducting current paths for strip-shaped superconductor structures, as well as metallic substrates, cf. e.g. U.S. Pat. No. 7,774,035 B2. External shunt systems that are coupled via bridge elements are also known, cf. e.g. EP 2 117 056 B1.

The above-mentioned European patent application 12 171 087.5 proposes to select a relatively high internal shunt resistance for strip-shaped superconductors having a relatively short length in relation to the width in order to reduce the danger of a burnout. Towards this end, an interposed electrically insulating intermediate layer separates a metallic substrate from a superconducting film. A thin protective layer of precious metal is disposed on the superconducting film.

EP 2 192 629 A1 discloses a current fault limiter with a superconductor configuration in which the superconducting films of superconducting elements are electrically connected to each other but the electrically conducting substrates of the superconducting elements are insulated from each other. An insulating intermediate layer is arranged between each superconducting film and conductive substrate of the superconducting elements.

US 2012/0040100 A1 discloses provision of a metallic substrate with a Y2O3 layer by means of solution deposition planarization (SDP) including dip coating and heat treatment, to subsequently provide an MgO buffer layer and deposition of a YBCO film on the buffer layer. The SDP treatment of the substrate reduces its roughness and improves the quality of the YBCO film.

It is the underlying purpose of the invention to provide a superconducting element that reduces the danger of damage in case of a quench.

SUMMARY OF THE INVENTION

This object is achieved by a superconducting element of the above-mentioned type which is characterized in that, in cross-section of the superconducting element, the insulating layer extends at both ends past the area of the substrate covered by the superconductor layer, the insulating layer galvanically separates the superconductor layer and the metallic protective layer from the substrate, and a thickness D of the insulating layer is selected in such a fashion that the superconducting element has a transverse breakdown voltage between the metallic substrate and both the superconductor layer as well as the metallic protective layer of at least 25 V.

The inventive superconducting element improves the self-protection of the superconducting element through substantial suppression of the energy output in case of a quench. Insulation of the metallic substrate with good conducting properties from the superconductor layer keeps the shunt resistance high. The high ohmic resistance in the area of the superconductor layer in case of a quench, in turn, limits the current flow through the superconducting element, thereby reducing the heat that develops in the superconducting element. The superconducting element can then be cooled below the transition temperature within less time after a quench and be correspondingly returned more quickly to normal operation. The risk of damaging overheating is also reduced.

In accordance with the invention, a metallic protective layer is used on the superconductor layer. The metallic protective layer blocks or impedes diffusion processes on the surface of the superconductor layer or, in general, chemical changes in the superconductor layer originating from the upper side of the superconductor layer, thereby safeguarding the physical properties of the superconductor layer and therefore its function as a superconductor. The metallic protective layer, which typically consists of a precious metal or a precious metal alloy does indeed represent a normally conducting current path parallel to the superconductor layer but has a relatively high resistance due to the smaller thickness of the metallic protective layer (typically 0.5 µm or less) such that the associated heat development in case of a quench remains small or can be kept small through suitable selection of the layer thickness of the metallic protective layer.

In order to prevent the development of heat which is undesired or could even damage the superconducting element, the invention provides that the insulating layer projects in cross-section (perpendicular to the longitudinal direction/current flow direction of the superconducting element) past the superconductor layer on both sides. A metallic protective layer that completely covers the superconductor layer (in particular, also its sides of short length in cross-section) can then easily terminate on the insulating layer (in the area of its projection past the superconductor layer) without contacting the metallic substrate. Due to the fact that the superconductor layer has a smaller width than the insulating layer, any inadvertent direct contact between the metallic substrate and the superconductor layer can be safely prevented.

In accordance with the invention, an insulating layer is used which has a high transverse breakdown voltage. A transverse voltage breakdown (perpendicular with respect to the longitudinal direction of the superconducting element), typically perpendicular to the boundary surface between the insulating layer and substrate would connect the metallic substrate directly or indirectly via the metallic protective layer to the superconductor layer, thereby opening a parallel, normally-conducting current path with small resistance which would result in considerable heating of the superconducting element in case of a quench. It should be noted that the superconductor layer and the metallic protective layer are substantially at the same electric potential and a voltage breakdown occurs where (i) the insulating layer has its weakest point ("weak spot") due to variable thickness and/or (ii) the electric field is maximized e.g. due to surface roughness, which may be the case both for the superconductor layer and also for the metallic protective layer in dependence on the geometry of the superconducting element.

Such a breakdown can be effectively prevented by a high transverse breakdown voltage which can be adjusted through suitable material selection and suitable selection of the thickness of the insulating layer and can be experimentally tested if required. The thickness of the insulating layer in the superconducting element is typically uniform. It is recommended to select the use of the inventive superconducting element in such a fashion that in case of a quench, the voltage that drops across the superconducting element maximally reaches a value that is below the breakdown voltage.

A superconducting element in accordance with the invention can be used in many different ways, in particular, in power supply lines, magnet coils and superconducting current fault limiters. It can withstand repeated or even long-lasting quenches, for example due to excess currents in a current fault limiter, without being damaged.

In particular, YBCO or another superconductor material of the ReBCO type can be used for the superconductor layer (Re: rare earth element). The substrate is mostly made of steel or Hastalloy. The substrate is usually of strip-shaped design, in most cases with a width of between 0.5 cm and 8 cm, preferably between 2.5 cm and 5 cm and with a thickness of between 0.05 mm and 0.5 mm, preferably between 0.1 mm and 0.2 mm.

In one advantageous embodiment of the inventive superconducting element, the metallic protective layer contacts the insulating layer. In this case, the insulating layer also directly prevents a voltage breakdown between the substrate and the metallic protective layer. Deposition of the metallic protective layer is facilitated in this case and the metallic layer also provides a good seal for the sides of the superconductor layer. In this case, the insulating layer preferably also extends at both ends past the area of the metallic substrate covered by the superconductor layer and the metallic protective layer in order to easily prevent inadvertent direct contact with the metallic substrate.

In another preferred embodiment, the metallic protective layer surrounds the superconductor layer like a hood in cross-section. This provides good sealing of the superconductor layer on all sides, in particular, on its side surfaces such that chemical changes to the superconductor layer are blocked or minimized.

In another particularly preferred embodiment, the insulating layer partly or completely also covers the short sides of the substrate in cross-section. In this fashion, inadvertent direct contact with the metallic substrate upon deposition of the superconductor layer or also with the metallic protective layer on the upper side of the substrate can even be better prevented and a voltage breakdown is made even more unlikely.

In another advantageous embodiment, the insulating layer also covers a lower side of the substrate facing away from the superconductor layer. Due to its large area, the lower side could possibly represent a contact area that should not be neglected even when the connection to the superconductor layer is realized via a material having poor conducting properties. Current paths that lead through the lower side of the substrate can be effectively blocked by also providing the lower side of the substrate with an insulating layer. A voltage breakdown then becomes even more unlikely.

In one particularly preferred embodiment, the insulating layer surrounds the substrate on all sides in cross-section. This prevents, with high reliability, use of the metallic substrate as a parallel current path in case of a quench. This case also facilitates deposition of the insulating layer through a precursor route or deposition from the liquid phase with dip coating and subsequent tempering. Due to the layer thicknesses of the insulating layer that are required for the invention, coating can be repeated.

In another preferred embodiment, a planarization layer is provided in addition to the insulating layer and is deposited on the substrate. A planarization layer reduces the surface roughness of the metallic substrate, thereby improving the quality of the superconductor layer. The insulating layer may alternatively simultaneously be used as a planarization layer. The planarization layer preferably has a thickness of 0.2 to 5 μm, preferably 0.5 to 2 μm. The planarization layer is preferably made from yttrium oxide or zirconium oxide and can surround the substrate on all sides.

In one advantageous embodiment, the thickness D of the insulating layer is selected in such a fashion that the superconducting element has a transverse breakdown voltage between the metallic substrate and both the superconductor layer as well as the metallic protective layer of at least 50 V, preferably at least 100 V, preferentially at least 300 V. For this reason, the superconducting element can be used for higher external voltages without causing excessive heating of the superconducting element in case of a quench. The transverse breakdown voltage is generally between 25 and 1500 V and preferably between 50 and 500 V.

In one advantageous embodiment, the insulating layer has a thickness D of at least 0.2 μm, preferably at least 2.0 μm, particularly preferred at least 3.5 μm, preferentially at least 5.0 μm. Larger layer thicknesses generally result in higher breakdown voltages. Smaller layer thicknesses, e.g. of less than 1 μm can generally only be obtained with highly insulating materials, in particular, with aluminium phosphate or aluminium oxide. The thickness of the insulating layer is typically maximally 10 μm: sometimes the layer thickness is maximally 3 μm. It should be noted that the insulating layer may generally also have a layer structure. The insulating layer is, however, preferably designed to be uniform (homogeneous).

In one preferred embodiment, the insulating layer contains one or more metal oxides, in particular yttrium-stabilized zircon oxide, zircon oxide, yttrium oxide, strontium titanate, aluminium oxide, ceroxide, gadolinium zirconate, barium zirconate and/or magnesium oxide. Metal oxides are materials that have good electrically insulating properties and are easy to deposit. The insulating layer can contain single or multiple oxides, in particular of elements of the second or third group of the periodic system of elements or mixtures thereof.

In another preferred embodiment, the insulating layer contains aluminium phosphate, in particular, wherein the insulating layer contains a mixture of aluminium phosphate with silicon oxide, germanium oxide, zircon oxide, yttrium oxide, strontium titanate, aluminium oxide, ceroxide, gadolinium zirconate, barium zirconate and/or magnesium oxide. Aluminium phosphate has turned out to be a particularly effective electric insulator in practice.

In another preferred embodiment, the superconducting element contains a buffer layer, wherein the buffer layer is disposed between the insulating layer and the superconductor layer, in particular, wherein the buffer layer contains at least one dielectric sub-layer. A buffer layer provides an optimum surface for depositing the superconductor layer irrespective of the properties of the insulating layer, thereby achieving a particularly high quality of the superconductor layer (of the superconducting film). It should be noted that the buffer layer may also contain at least one metallic sub-layer. Typical materials that may be used in the buffer layer are $CeO_2$, MgO and InSn. The buffer layer is typically deposited with IBAD (ion beam assisted deposition). As an alternative to this embodiment, the insulating layer or an upper part thereof may also be used as a buffer layer.

In a further advantageous embodiment, an electrically conducting connection between the metallic substrate and the superconductor layer is provided approximately in the center of the insulating layer in a longitudinal section of the superconducting element. In this fashion, the voltage or electric field strength $E_\perp$ applied across the insulating layer can approximately be halved in case of a quench.

In another preferred embodiment, the metallic protective layer has a thickness between 0.07 μm and 3 μm and/or the metallic protective layer contains Ag, Au, Rt, Pd, Cu, Ni, Cr, Al, Y or mixtures or alloys thereof. These thicknesses and materials have turned out to be favourable in practice. It should be noted that the thickness of the metallic protective layer is preferably selected to be 0.5 μm or less in order to keep the internal shunt resistance correspondingly small and also to keep the production costs low mainly when expensive materials such as gold and silver are used in the metallic protective layer.

In another preferred embodiment, the metallic protective layer has a longitudinal resistance in the longitudinal direction of the superconducting element of between 5 and 100 ohm per meter of length and for each cm of width of the superconducting element, preferably between 15 and 40 ohm per meter of length and for each cm of width of the superconducting element. In practice, these resistance values have behaved well in case of a quench, in particular, wherein the superconducting element was only slightly heated.

The present invention also concerns use of an inventive superconducting element as described above on an external voltage source which applies an external voltage $V_{ext}^{elem}$ to the superconducting element in case of a quench of the superconducting element, wherein the length L of the superconducting element is selected such that the electric field $E_\parallel$ along the superconducting element, which is generated in case of a quench with $E_\parallel = V_{ext}^{elem}/L$ is smaller than a critical electric field $E_\parallel^{krit}$ that the superconductor layer can still withstand without being damaged, and wherein the thickness D of the insulating layer of the superconducting element is selected such that the following applies:

$$D \geq k \cdot \left[ \frac{E_\parallel \cdot L}{m \cdot E_\perp^{krit}} - \sum_i \frac{\varepsilon_i \cdot d_i}{\varepsilon_{Iso}} \right]$$

with i: count variable of dielectric layers of the superconducting element both between the substrate and the superconductor layer and also between the substrate and the metallic protective layer without the insulating layer, $\varepsilon_i$: dielectric constant of the i-th dielectric layer, $\varepsilon_{Iso}$: dielectric constant of the insulating layer, $d_i$: thickness of the i-th dielectric layer, $E_\perp^{krit}$: transverse breakdown field strength in the insulating layer, m: geometrical parameters with m=2 with an electrically conducting connection between the metallic substrate and the superconductor layer provided in the longitudinal section approximately in the center of the insulating layer and m=1 without such an electrically conducting connection, and k: safety parameter with k≤1. This selection of L and D ensures that the superconducting element easily withstands multiple and also long-lasting quenches. $E_\parallel^{krit}$ can be easily experimentally determined for a certain type of superconductor layer and $E_\perp^{krit}$ can also be easily experimentally determined for an insulating layer material. A reserve for unexpected loads (voltage peaks) can be provided by selecting a safety parameter k>1. k is preferably at least 3.

In one preferred variant of the inventive use, the following applies: 0.5 V/cm≤$E_\parallel^{krit}$≤10 V/cm and/or $2 \cdot 10^3$ V/cm≤$E_\perp^{krit}$≤$5 \cdot 10^5$ V/cm. These value ranges are a good basis to be worked with in practice.

In another advantageous variant, L≥50 cm, preferably L≥150 cm, particularly preferred L≥200 cm. These lengths are still suitable for practical production. Larger lengths basically reduce the field strength $E_\parallel$ parallel to the longitudinal direction of the superconducting substrate.

In another particularly preferred variant of the inventive use, the superconducting element is included in a series connection of further superconducting elements, the superconductor layers of which are electrically connected to each other and the substrates of which are electrically insulated from each other, and the voltage $V_{ext}^{elem}$ that is applied to the superconducting element in case of a quench thereof is $V_{ext}^{elem} = V_{ext}^{ges} \cdot L/L_{ges}$, with $V_{ext}^{ges}$: the overall voltage applied by the external voltage source across the series connection of superconducting element and further superconducting elements, and $L_{ges}$: sum of the length of the superconducting element and of the lengths of the further superconducting elements. The series connection of the superconducting elements enables distribution of the overall applied external voltage $V_{ext}^{ges}$ to the (typically similar) superconducting elements. In particular, the external voltage $V_{ext}^{elem}$ applied to the superconducting element can be divided via a sufficiently large number or sufficiently large length of the further superconducting elements such that neither $E_\parallel^{krit}$ (nor $E_\perp^{krit}$) are exceeded.

In one further development of this variant, the following applies: $V_{ext}^{ges}$≥10 kV. The advantages of the high dielectric strength of the insulating layer in the superconducting element are particularly evident for high external voltages.

In another preferred variant, the superconducting element is used in a superconducting current fault limiter. Current fault limiters require superconducting elements having a particularly high quench resistance, since in this case the quench is part of the desired safety function of the current fault limiter. The current fault limiter may be a resistive or capacitive type of current fault limiter.

Further advantages of the invention can be extracted from the description and the drawing. The features mentioned above and below may be used in accordance with the invention either individually or collectively in arbitrary combination. The embodiments shown and described are not to be taken as exhaustive enumeration but have exemplary character for describing the invention.

The invention is illustrated in the drawing and is explained in more detail with reference to embodiments.

BRIEF DESCRIPTION OF THE DRAWING

FIG. 3b shows a schematic longitudinal section of the superconducting element of FIG. 3a;

FIG. 3c shows a schematic perspective view of the superconducting element of FIG. 3a.

DESCRIPTION OF THE PREFERRED EMBODIMENT

It should be noted that the structures of the figures described below are largely shown in an exaggerated fashion in order to clearly show the features of the invention. The figures are therefore not to be taken to scale.

Figure 1:
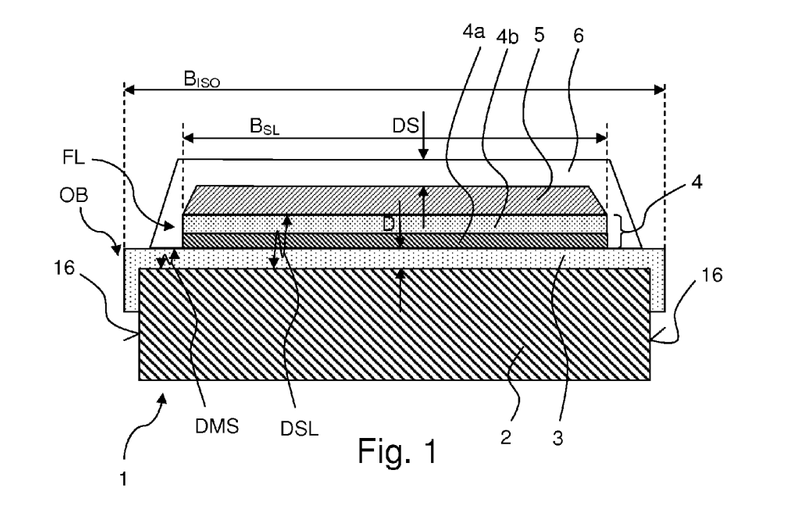
FIG. 1 shows a schematic cross-sectional view of a first embodiment of an inventive superconducting element.

FIG. 1 shows a first embodiment of an inventive superconducting element 1 in cross-section (perpendicular to the current-carrying direction/longitudinal direction). The superconducting element 1 has a substantially strip-shaped structure.

An insulating layer 3, e.g. of aluminium phosphate, is deposited on a metallic substrate 2, e.g. of steel. The insulating layer 3 has a thickness D and the insulating layer 3 is deposited in this case not only on the upper side of the substrate 2 but also in an upper area OB on the short sides 16 of the substrate 2.

A buffer layer 4 with two sub-layers 4a, 4b is deposited on the insulating layer 3. The lower sub-layer 4a is electrically conducting in the illustrated embodiment (e.g. a CrNi alloy) and the upper sub-layer 4b is electrically insulating (e.g. $CeO_2$).

A superconductor layer 5 (preferably of high-temperature superconductor material having a transition temperature of 40 K or more, in particular, YBCO) is deposited on the buffer layer 4. The lateral expansion (width) $B_{SL}$ of the superconductor layer 5 is smaller than the lateral expansion (width) $B_{Iso}$ of the insulating layer 3 and the insulating layer 3 projects at both ends (left and right-hand side) past the superconductor layer 5 and past the area of the substrate 2 covered by it.

A metallic protective layer 6 (e.g. an AuAg alloy) having a thickness DS is, in turn, deposited on the superconductor layer 5. The metallic protective layer 6 thereby covers the superconductor layer 5 and in this case also the buffer layer 4 like a hood. The lateral flanks FL of the metallic protective layer 6 also seal the side surfaces of the superconductor layer 5 such that it is protected on all sides in cross-section from chemical attacks. The lower ends of the flanks FL of the metallic protective layer 6 contact the insulating layer 3 such that the insulating layer 3 prevents electric contact between the metallic protective layer 6 and the metallic substrate 2. The flanks FL thereby contact the insulating layer 3, in particular, in the area that laterally projects past the superconductor layer 5. The flanks FL preferably utilize only half or less of the laterally projecting area of the insulating layer 3 as a support area.

The thickness D of the insulating layer 3 is sufficient to prevent a transverse voltage breakdown DSL between the metallic substrate 2 and the superconductor layer 5 as well a transverse voltage breakdown DMS between the metallic substrate 2 and the metallic protective layer 6 up to a voltage of at least 25 V, preferably at least 50 V. In other words, a voltage difference of 25 V, preferably 50 V, between the metallic substrate 2 and both the metallic protective layer 6 as well as the superconductor layer 5 (which generally have an approximately identical potential), does not yet cause a voltage breakdown. In this case, it should be noted that the required thickness D depends, in particular, on the material of the insulating layer 3. The breakdown voltage increases with increasing thickness D.

Methods that are known per se can, in general, be used for depositing each of the layers 3, 4, 5, 6, e.g. chemical vapor deposition (CVD) and physical vapour deposition (PVD), including pulsed laser deposition or also deposition from the liquid phase (chemical solution deposition CSD or metal organic deposition MOD, typically with dip coating, spray coating or printing and subsequent tempering, in particular, for the insulating layer, in most cases in a multi-stage deposition process).

Figure 2:
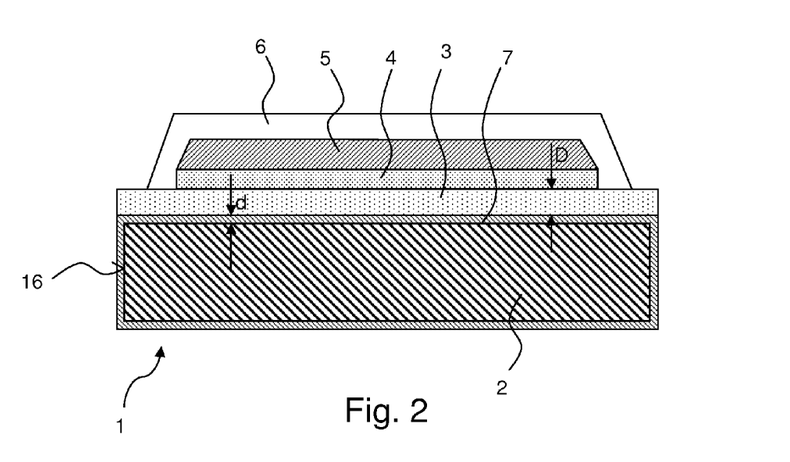
FIG. 2 shows a schematic cross-sectional view of a second embodiment of an inventive superconducting element.

FIG. 2 shows a further embodiment of an inventive superconducting element 1 in cross-section.

In this case, the metallic substrate 2 is surrounded on all sides by a planarization layer 7 which was deposited e.g. by means of dip coating and tempering. The planarization layer 7, however, has a relatively thin thickness d, e.g. approximately 0.3 μm and has therefore only a small dielectric strength.

For this reason, an insulating layer 3 of a thickness D is applied to the upper side of the superconducting element 1, which provides a breakdown voltage of at least 25 V, preferably at least 50 V, between the metallic substrate 2 and both a superconductor layer 5 arranged on a dielectric buffer layer 4 as well as the metallic protective layer 6. The metallic protective layer 6 again covers the superconductor layer 5 and also the buffer layer 4 like a hood.

The insulating layer 3 again clearly laterally projects past the superconductor layer 5. However, there is no insulating layer 3 on the short sides 16 of the substrate 2 in this embodiment.

Figure 3A:
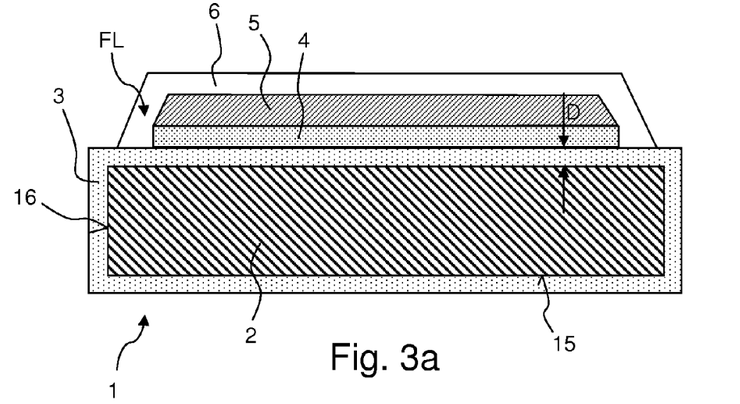
FIG. 3a shows a schematic cross-sectional view of a third embodiment of an inventive superconducting element.

FIG. 3a shows a cross-section of a third embodiment of an inventive superconducting element 1.

The metallic substrate 2 is thereby surrounded in cross-section on all sides by an insulating layer 3 such that also the lower side 15 and the short sides 16 of the substrate 2 on the left-hand and right-hand sides are also covered by the insulating layer 3. A dielectric buffer layer 4 is deposited on the insulating layer 3 and a superconductor layer 5 is again deposited on the dielectric buffer layer 4. A metallic protective layer 6 surrounds the superconductor layer 5 and also the buffer layer 4 like a hood. The flanks FL of the metallic protective layer 6 are each supported on areas of the insulating layer 3 which laterally project past the superconductor layer 5 and past the area of the substrate 2 covered by the superconductor layer 5.

The insulating layer 3 can be easily deposited through dip coating and tempering, wherein, for obtaining an inventive breakdown voltage between the metallic substrate 2 and both the metallic protective layer 6 as well as the superconductor layer 5 of at least 25 V, preferably at least 50 V, several deposition iterations can be performed in order to obtain the required layer thickness D.

Figure 3B:
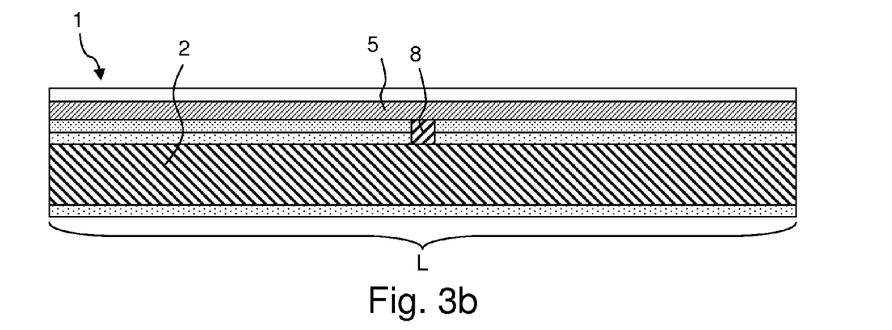

FIG. 3b shows a longitudinal section (along the current-carrying direction) through the superconducting element 1 of FIG. 3a. At approximately half the longitudinal extension of the superconducting element 1, an electrically conducting connection 8 is provided e.g. of a precious metal or a precious metal alloy, which connects the metallic substrate 2 to the superconductor layer 5. For this reason, in case of a quench, the external voltage applied across the length L of the superconducting element 1 is approximately effectively halved with respect to the voltage difference between the substrate 2 and the superconductor layer 5, thereby correspondingly reducing the danger of a voltage breakdown through the insulating layer 3.

Figure 3C:
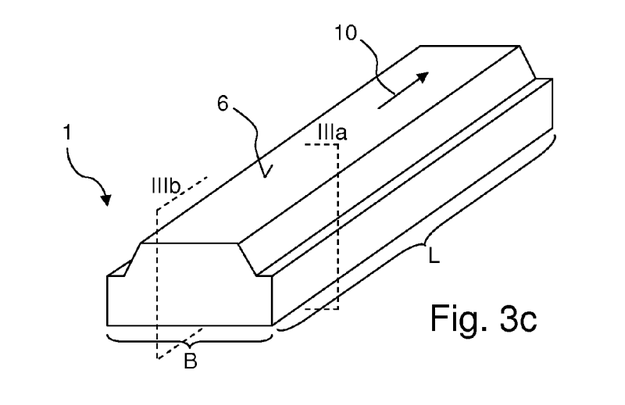

FIG. 3c shows a schematic perspective view of the superconducting element 1 of FIGS. 3a and 3b. The cross-sectional plane of FIG. 3a is marked with IIIa and the longitudinal sectional plane of FIG. 3b is marked with IIIb.

The superconducting element 1 is used to superconductingly carry a current that flows in the direction of arrow 10 (longitudinal direction). The superconducting element has the length L and width B. In case of a quench, only the metallic protective layer 6 is available as normally conducting current path for the superconductor layer. It is, however, relatively thin such that a longitudinal resistance of preferably between 5 and 100 ohm for each cm of width is obtained (the longitudinal resistance is determined from the cross-sectional area of the metallic protective layer 6 and the specific resistance of the protective layer material). With a length L of e.g. 1.50 m, a width B of 4 cm and a longitudinal resistance of 20 ohm for each m of length and for each cm of width, one obtains e.g. an absolute resistance of the metallic protective layer 6 between the end faces of the superconducting element 1 of $$R=(20\ ohm*cm/m)*1.50\ m/4\ cm=7.5\ ohm.$$

Figure 4:
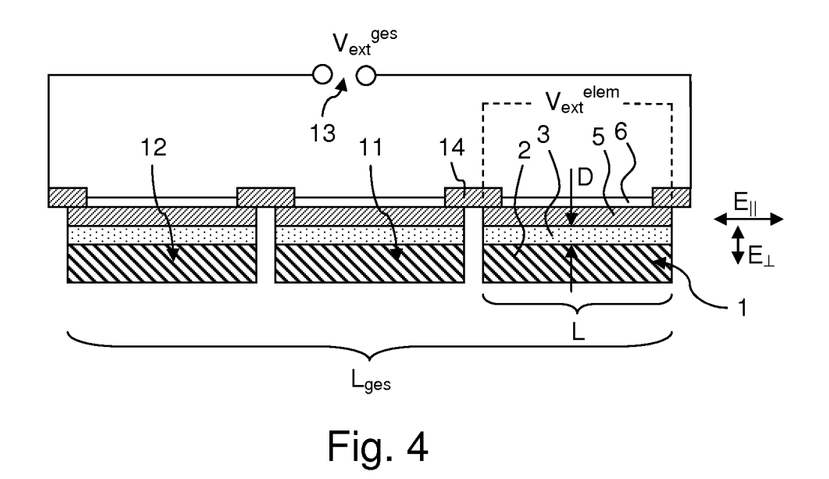
FIG. 4 shows a schematic view of a series connection with a superconducting element and further superconducting elements in accordance with the invention.

FIG. 4 shows a series connection of an inventive superconducting element 1 and further, in the present case identically constructed, superconducting elements 11, 12. Although only three superconducting elements 1, 11, 12 are shown in total, the series connection may also comprise more superconducting elements, for example 50 or more. This series connection may e.g. be used as a resistive current fault limiter for a consumer load that is connected in series but not shown in detail.

The series connection is exposed to a voltage $V_{ext}^{ges}$ from an external voltage source 13, which, in case of a quench, drops in a distributed fashion across the superconducting elements 1, 11, 12. It should be noted that the insulating layers 3 thereby galvanically separate the metallic substrates 2 from the superconductor layers 5 and the metallic protective layers 6. A portion $V_{ext}^{elem}$ of $V_{ext}^{ges}*L/L_{ges}$ drops across the superconducting element 1, wherein $L_{ges}$ represents the sum of the lengths L of the individual superconducting elements 1, 11, 12. The intermediate spaces between the superconducting elements 1, 11, 12 are generally negligibly small in comparison with $L_{ges}$ although the substrates 2 are electrically insulated from each other. It should be noted that the superconductor layers 5 are superconductingly connected to each other via bridges 14 and, in case of a quench, are connected to each other in a normally conducting fashion.

The voltage $V_{ext}^{elem}$ applied to the superconducting element 1 uniformly drops across the superconductor layer 5. One obtains an electric field $E_{\parallel}$ of $V_{ext}^{elem}/L$ in the superconductor layer 5. By means of sufficient subdivision (in particular a sufficient number of superconducting elements) the field strength can be kept below a critical field strength $E_{\parallel}^{krit}$ above which the superconductor layer 5 would be damaged.

Since the substrate 2 is electrically conductive, its electric potential is uniform. Since the two ends of the superconductor layer 5 are exposed to $V_{ext}^{elem}$, a voltage difference of locally up to $V_{ext}^{elem}$ can prevail between the substrate 2 and the superconductor layer 5, which must not cause a perpendicular voltage breakdown through the insulating layer 3 if the substrate 2 should not carry any current in case of a quench. The transverse field strength $E_{\perp}$ in the insulating layer 3 in the present case is correspondingly $V_{ext}^{elem}/D$, wherein D describes the layer thickness of the insulating layer 3. It should be noted that, when the electrical connection is in the center (see FIG. 3b), the applied voltage is effectively halved in view of $E_{\perp}$.

The transverse breakdown field strength $E_{\perp}^{krit}$ is a property of the material used in the insulating layer 3. When this is known and the applied external voltage $V_{ext}^{elem}$ is also known, the required thickness D can be determined, preferably with a safety margin. In case further dielectric layers are provided between the substrate 2 and the superconductor layer 5 and between the substrate 2 and the metallic protective layer 6 (e.g. a planarization layer or a dielectric buffer layer) in addition to the insulating layer 3, these can reduce the required layer thickness D of the insulating layer 3. Only a dielectric layer of this type that separates both the substrate 2 and the superconductor layer 5 and also the substrate 2 and the metallic protective layer 6 over the total respective widths, can contribute to a reduction of the required layer thickness D (in the embodiment of FIG. 1, the dielectric buffer layer 4a cannot contribute since it does not laterally extend to below the entire metallic protective layer 6. In FIG. 3a, in turn, the dielectric buffer layer 4 cannot contribute since its lateral extension is not sufficient). In this connection, the contribution of the further dielectric layers can be approximated by means of their thickness d and the ratio between the dielectric constant and the insulating layer 3 and a respective further dielectric layer i. In a preferred embodiment, the metallic protective layer (6) has a longitudinal resistance in the longitudinal direction of the superconducting element (1) of between 5 and 100 ohm per meter of length (L) and for each cm of width (B) of the superconducting element (1), preferably between 15 and 40 ohm per meter of length (L) and for each cm of width (B) of the superconducting element (1).

In accordance with the invention, the superconducting elements 1, 11, 12 have breakdown voltages of 25V or more, preferably 50 V or more. For this reason, external voltages in the kV range which may be required for superconducting current fault limiters, can also be handled being connected in series with a manageable number of superconducting elements 1, 11, 12.

A typical superconducting element in accordance with the invention has as substrate a strip of stainless steel with a thickness between 50 μm and 200 μm, preferably approximately 100 μm and a width of 20 to 80 mm, preferably approximately 40 mm, moreover an insulating layer, e.g. of yttrium-stabilized zircon with a thickness between 1.5 µm and 10 µm (wherein the thickness is sufficient to guarantee a breakdown voltage of at least 25 V in dependence on the material quality), further optionally a buffer layer, e.g. of CeO2 having a thickness of between 0.05 µm and 0.2 µm, preferably 0.1 µm, moreover a superconductor layer, preferably a high-temperature superconductor layer, e.g. of YBCO with a thickness between 0.8 µm and 4 µm, preferably between 1 µm and 2 µm and moreover a metallic protective layer, e.g. of an Ag—Au alloy (50 weight %/50 weight %). A superconducting element may have a length of 0.5 m or more. A superconducting element of this structure withstands a plurality of quenches of a duration of 300 seconds each without being damaged.

It should be noted that the above-mentioned quantitative magnitudes that depend on material properties, in particular, a longitudinal resistance of the metallic protective layer and the transverse breakdown voltage can be determined at room temperature (20° C.).

In summary, the invention describes a superconducting strip conductor, in particular an HTSL strip conductor, the superconductor layer (superconducting film) of which is covered by a metallic protective layer, and wherein an insulating layer electrically separates its metallic substrate (substrate band) from the superconductor layer and the metallic protective layer. The insulating layer thereby projects in cross-section perpendicularly with respect to the longitudinal direction (current-carrying direction) of the strip conductor on both sides past the surface area of the metallic substrate covered by the superconductor layer and preferably also covered by the metallic insulating layer (typically with a respective projection of at least 1 mm, preferably at least 2 mm) or even completely covers the metallic substrate. The insulating layer has sufficient thickness to prevent a transverse voltage breakdown or a perpendicular voltage breakdown through the insulating layer up to at least 25 V, preferably at least 50 V. The voltage applied between the metallic substrate and the superconductor layer in case of a quench (or between the metallic protective layer which is substantially at the same electric potential as the superconductor layer) thereby generates an electric field which substantially extends perpendicularly through the insulating layer (and in particular substantially perpendicularly through the boundary surfaces between the insulating layer, the metallic substrate and the superconductor layer or the metallic protective layer). In case of a quench, the inexpensive and easy-to-manage metallic substrate does not contribute to a normally conducting current flow, whereby heating of the strip conductor is reduced and return into the superconducting state is facilitated and accelerated.

I claim:

1. A superconducting element comprising:
a metallic substrate;
a superconductor layer;
a metallic protective layer; and
an insulating layer disposed between said substrate and said superconductor layer, wherein, in cross-section of the superconducting element, said insulating layer extends at both ends thereof past an area of said substrate covered by said superconductor layer to galvanically separate said superconductor layer and said metallic protective layer from said substrate, said insulating layer thereby having a thickness which is selected in such a fashion that the superconducting element has a transverse breakdown voltage between said metallic substrate and both said superconductor layer as well as said metallic protective layer of at least 25 V, wherein said metallic protective layer contacts said insulating layer.

2. The superconducting element of claim 1, wherein, in cross-section, said metallic protective layer surrounds said superconductor layer like a hood.

3. The superconducting element of claim 1, wherein, in cross-section, said insulating layer partly or completely covers short sides of said substrate.

4. The superconducting element of claim 1, wherein said insulating layer covers a lower side of said substrate facing away from said superconductor layer.

5. The superconducting element of claim 1, wherein, in cross-section, said insulating layer surrounds said substrate on all sides.

6. The superconducting element of claim 1, further comprising a planarization layer, which is deposited on said substrate.

7. The superconducting element of claim 1, wherein said thickness of said insulating layer is selected in such a fashion that the superconducting element has a transverse breakdown voltage between said metallic substrate and both said superconductor layer as well as said metallic protective layer of at least 50 V.

8. The superconducting element of claim 1, wherein said insulating layer has a thickness D of at least 0.2 µm.

9. The superconducting element of claim 1, wherein said insulating layer contains one or more metal oxides, yttrium-stabilized zircon oxide, zircon oxide, yttrium oxide, strontium titanate, aluminium oxide, ceroxide, gadolinium zirconate, barium zirconate and/or magnesium oxide.

10. The superconducting element of claim 1, wherein said insulating layer contains aluminium phosphate or a mixture of aluminium phosphate with silicon oxide, germanium oxide, zircon oxide, yttrium oxide, strontium titanate, aluminium oxide, ceroxide, gadolinium zirconate, barium zirconate and/or magnesium oxide.

11. The superconducting element of claim 1, further comprising a buffer layer or a buffer layer having at least one dielectric sub-layer, wherein said buffer layer is disposed between said insulating layer and said superconductor layer.

12. The superconducting element of claim 1, further comprising an electrically conducting connection between said metallic substrate and said superconductor layer and disposed, in longitudinal section of the superconducting element, approximately in a center of said insulating layer.

13. The superconducting element of claim 1, wherein said metallic protective layer has a thickness of between 0.07 µm and 3 µm and/or said metallic protective layer contains Ag, Au, Rt, Pd, Cu, Ni, Cr, Al, Y or mixtures or alloys thereof.

14. The superconducting element of claim 1, wherein said metallic protective layer has a longitudinal resistance in a longitudinal direction of the superconducting element of between 5 and 100 ohm per meter of length and for each cm of width of the superconducting element or of between 15 and 40 ohm per meter of length and for each cm of width of the superconducting element.

15. A method for using the superconducting element of claim 1 on an external voltage source which applies an external voltage $V_{ext}^{elem}$ to the superconducting element in case of a quench of the superconducting element, the method comprising the steps of:
a) selecting a length L of the superconducting element such that an electric field $E_\parallel$ along the superconducting element, which is generated in case of a quench, with $E_\parallel = V_{ext}^{elem}/L$, is smaller than a critical electric field $E_\parallel^{krit}$ that the superconductor layer can still withstand without being damaged; and b) selecting a thickness D of the insulating layer such that the following applies:

$$D \geq k \cdot \left[ \frac{E_\parallel \cdot L}{m \cdot E_\perp^{krit}} - \sum_i \frac{\varepsilon_i \cdot d_i}{\varepsilon_{Iso}} \right]$$

with i: count variable of dielectric layers of the superconducting element between both the substrate and the superconductor layer as well as between the substrate and the metallic protective layer without the insulating layer, $\varepsilon_i$: dielectric constant of the i-th dielectric layer, $\varepsilon_{Iso}$: dielectric constant of the insulating layer, $d_i$: thickness of the i-th dielectric layer, $E_\perp^{krit}$: transverse breakdown field strength in the insulating layer, m: a geometrical parameter, wherein m=2 when the superconducting element has an electrically conducting connection between the metallic substrate and the superconductor layer located, in longitudinal section, approximately in a center of the insulating layer and m=1 without such an electrically conducting connection, and k: safety parameter, wherein k≥1.

16. The method of claim 15, wherein the superconducting element is included in a series connection of further superconducting elements, superconductor layers of which are electrically connected to each other and substrates of which are electrically insulated from each other, wherein the voltage $V_{ext}^{elem}$ that is applied to the superconducting element in case of a quench thereof is $V_{ext}^{elem} = V_{ext}^{ges} \cdot L/L_{ges}$, with $V_{ext}^{ges}$: an overall voltage applied by the external voltage source across a series connection of superconducting element and further superconducting elements, and $L_{ges}$: sum of the length of the superconducting element and lengths of the further superconducting elements.

17. The method of claim 16, wherein $V_{ext}^{ges} \geq 10$ kV.

18. The method of claim 15, wherein 0.5 V/cm≤$E_\parallel^{krit}$≤10 V/cm and/or 2·10³ V/cm≤$E_\perp^{krit}$≤5·10⁵ V/cm.

19. The method of claim 15, wherein L≥50 cm, L≥150 cm or L≥200 cm.

20. The method of claim 15, wherein the superconducting element is used in a superconducting current fault limiter.

* * * * *

UNITED STATES PATENT AND TRADEMARK OFFICE
CERTIFICATE OF CORRECTION

PATENT NO. : 9,640,979 B2
APPLICATION NO. : 14/327581
DATED : May 2, 2017
INVENTOR(S) : Alexander Usoskin

Page 1 of 1

It is certified that error appears in the above-identified patent and that said Letters Patent is hereby corrected as shown below:

On the Title Page (73) Assignee should read: Bruker HTS GmbH, Hanau (DE)

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*